(12) United States Patent
Smith

(10) Patent No.: US 6,436,589 B1
(45) Date of Patent: Aug. 20, 2002

(54) RETICLE HAVING AN INTERLEAVE KERF

(75) Inventor: Scott D. Smith, Newtown, CT (US)

(73) Assignee: Nikon Precision Incorporated, Belmont, CA (US)

( * ) Notice: Subject to any disclaimer, the term of this patent is extended or adjusted under 35 U.S.C. 154(b) by 83 days.

(21) Appl. No.: 09/731,801

(22) Filed: Dec. 8, 2000

(51) Int. Cl.[7] .................................................. G03F 9/00
(52) U.S. Cl. ............................................................ 430/5
(58) Field of Search ............................. 430/5, 296, 322, 430/324, 394, 22

(56) References Cited

U.S. PATENT DOCUMENTS 6,194,103 B1 * 2/2001 Tzu et al. ........................ 430/5

* cited by examiner

Primary Examiner—S. Rosasco
(74) Attorney, Agent, or Firm—Finnegan, Henderson, Farabow, Garrett & Dunner, L.L.P.

(57) ABSTRACT

This invention includes a reticle used for making a semiconductor device in a photolithography process. The reticle has a device exposure region having sides and a device pattern within an area defined by the sides, an opaque chrome region disposed adjacent to the device region, and a kerf region surrounded by the opaque chrome region, the kerf region being offset from the sides of the device exposure region by the opaque chrome region. The reticle should facilitate a double exposure method of a photolithography process by interleaving adjacent exposures of a wafer during the photolithography process, while allowing the single exposure of the respective kerfs.

7 Claims, 2 Drawing Sheets

RETICLE HAVING AN INTERLEAVE KERF

BACKGROUND OF THE INVENTION

1. Field of the Invention

The present invention relates to a photo lithographic mask, also called a reticle, used in a photolithography process for a semiconductor wafer. More particularly, the present invention is directed to a design of a reticle used for a photographic process for the manufacture of semiconductor chips.

2. Description of the Related Art

Manufacturing semiconductor chips involves a process called photolithography. In a typical photolithography process, a thin layer of a photosensitive material or photo resist is deposited over a semiconductor wafer. During the photolithography process, illumination such as ultra-violet light is illuminated through a lens system and a photo lithographic mask or reticle to the semiconductor wafer. The reticle has a particular device pattern and the pattern is exposed over a portion of the wafer by the illumination to create exposed and unexposed regions on the wafer. Then these exposed or unexposed regions are washed away to define circuit elements on the wafer. This photolithography process is repeated many times to define many circuit elements on the wafer. At the end of the photolithography process, the wafer having the exposed device pattern is cut into semiconductor chips.

Typically, a reticle is made from a transparent plate and has a device exposure region and an opaque chrome region. The plate is often made of glass, quartz, or the like, and the opaque chrome region typically includes a layer of chrome. The device exposure region generally has a square or rectangular shape and is positioned in the center of the reticle. The device exposure region includes transparent portions and opaque portions defining a device pattern. The transparent portions in the device exposure region allow illumination from the light source to travel though them and reach the wafer. On the other hand, the opaque portions in the device region block the light and the light does not reach the wafer, and this exposing the device pattern on the wafer.

FIG. 1 illustrates a conventional reticle. FIG. 2 is a magnified view of the circled portion II of the reticle in FIG. 1. The reticle 10 has a square device region 12 surrounded by an opaque chrome region 14. For the sake of simplicity, a device pattern 13 in the device region is not illustrated in detail in FIGS. 1 and 2. As illustrated in FIG. 2, there is a kerf region 16 at the periphery of the device region 12 between the device region 12 and the opaque chrome region 14. The kerf region 16 contains important information regarding the photolithography process of the wafer. (not illustrated in the drawings) The kerf region typically includes test structures to verify the performance of a photolithography process. For example, the kerf region may include alignment marks to check the accuracy of the reticle alignment and registration marks to measure the resolution of the device pattern during the photolithography process. After the photolithography process, the wafer is diced into semiconductor chips through the kerf region. FIG. 3 shows a portion of a wafer after the photolithography process using the kerf shown in FIGS. 1 and 2. FIG. 3A illustrates a magnified portion of the wafer. Four device regions 12 separated by the four contiguous kerf regions 16 are shown in FIG.

The recent growth in the demand for more powerful, faster computer chips requires smaller. and more devices in a semiconductor chip. As a result, semiconductor manufacturers are driven to produce more dense semiconductor chips by, for example, improving resolution capability of photolithography machines.

One possible method to accentuate the resolution capability of a photolithography machine is a "double exposure method." In the double exposure method, a wafer is exposed at a normal dose of light through a reticle. Then the wafer is slightly shifted with respect to the reticle, and subsequently exposed again at a nominal dose of the light through the reticle. A device structure is created as a result of a sum of the two exposures. This double exposure method can enhance the resolution capability of the photolithography machines, and facilitate more dense semiconductor chips.

This double exposure method, however, presents another challenge to the photolithography process. Though the device exposure region is exposed two times in the double exposure method, the kerf region, containing the test structures, cannot be exposed multiple times. In another words, one area of the exposure region in a wafer needs to be doubly exposed; on the other hand, another area of the exposure region needs to be exposed only a single time.

A device called a reticle blind can be used to block the kerf region of the reticle to prevent them to be exposed for the second time. In the conventional reticle, as shown in FIGS. 1 and 2, the kerf region 16 is located adjacent to the device region 12. Current lithography machines, however, do not have a reticle blind to accurately block the kerf region 16 and the opaque chrome region 14, and expose only the device region 12.

Therefore, there is a need for a reticle that can accentuate the resolution of a photolithography machine and yet meets the challenge associated with the double exposure method within mechanical constraints of the current photolithography machines.

SUMMARY OF THE INVENTION

The object of the invention is to facilitate the double exposure method of a photolithography process by addressing the above-identified problems associated with the double exposure method.

Additional objects and advantages of the invention will be set forth in part in the description which follows, and in part will be obvious from the description, or may be learned by practice of the invention. The advantages and purpose of the invention will be realized and attained by the elements and combinations particularly pointed out in the appended claims.

To attain the advantages and in accordance with the purposes of the invention, as embodied and broadly described herein, the invention includes a reticle for making a semiconductor device in a photolithography process. The reticle has a device exposure region having sides and a device pattern within an, area defined by the sides, an opaque chrome region disposed adjacent to the device region, and a kerf region surrounded by the opaque chrome region. The kerf region is offset from the sides of the device exposure region by the opaque chrome region.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principles of the invention. In the drawings.

FIG. 4 is a top view of a reticle according to the present invention;

DESCRIPTION OF THE PREFERRED EMBODIMENTS

Reference will now be made in detail to the present preferred embodiment of the invention, an example of which is illustrated in the accompanying drawings. Wherever possible, the same reference numbers will be used throughout the drawings to refer to the same or like parts.

In accordance with the invention, a reticle for making a semiconductor device in a photolithography process is generally provided with a device exposure region having sides and a device pattern within an area defined by the sides, an opaque chrome region disposed adjacent to the device region, and a kerf region surrounded by the opaque chrome region. The kerf region is offset from the sides of the device exposure region by the opaque chrome region.

Figure 5:
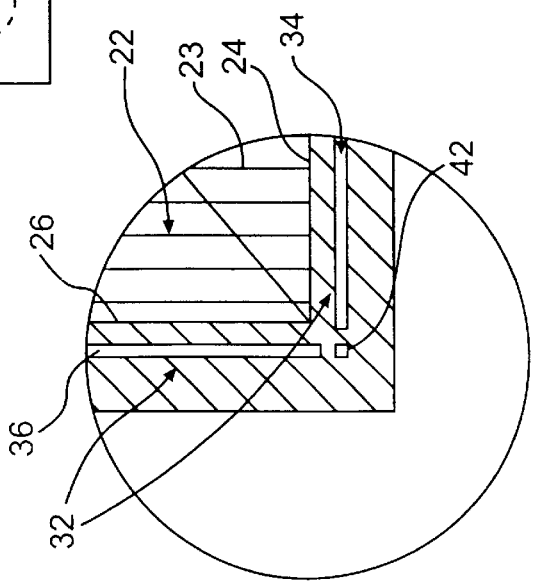
FIG. 5 is a top, magnified view of a portion of the reticle of FIG. 4.

In the embodiment illustrated in FIGS. 4 and 5, a reticle, generally designated by the reference numeral 20, is shown to include a device exposure region 22 and an opaque chrome region 32. The reticle 20 includes a transparent substrate made of glass, quartz, or the like. In a photolithography process, the reticle 20 is placed between a light source and a wafer.

The device exposure region 22 typically has a square or rectangular shape having first, second, third, and fourth sides, 24, 26, 28, 30, respectively. The device exposure region 22 may be located approximately in the center of the reticle 20, and includes transparent portions and opaque portions. The transparent portions and the opaque portions in the device exposure region 22 are formed in a particular device pattern 23. In the photolithography process, this pattern is exposed to the wafer to create a semiconductor chip having function defined by the device pattern 23. FIGS. 4 and 5 do not illustrate the device pattern 23 in the device exposure region 22 in detail.

The opaque chrome region 32 is disposed adjacent to the device exposure region 22, and preferably surrounds the device exposure region 22. The opaque chrome region 32 typically has a layer of chrome to block the light traveling from the source of light to the wafer. However, other opaque materials may be suitable as the layer in the opaque chrome region 32.

FIG. 5 illustrates a rmagnified view of the area within a sight circle V in the reticle 20 shown in FIG. 4. The reticle 20 has a kerf region 34 surrounded by the opaque chrome region 32. As mentioned previously, the kerf region 34 has test structures to verify the performance of the photolithography process on the wafer. For example, the test structures may include alignment marks, process monitors, registration marks and so on. At the end of the photolithography process, the exposed wafer is diced within the kerf region 34 into multiple semiconductor chips.

Figure 3:
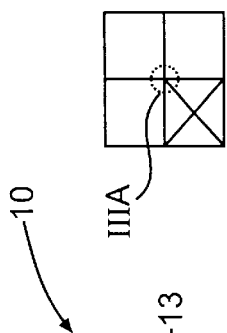
FIG. 3 is a top view of a wafer exposed using the reticle of FIG. 1.
Figure 1:
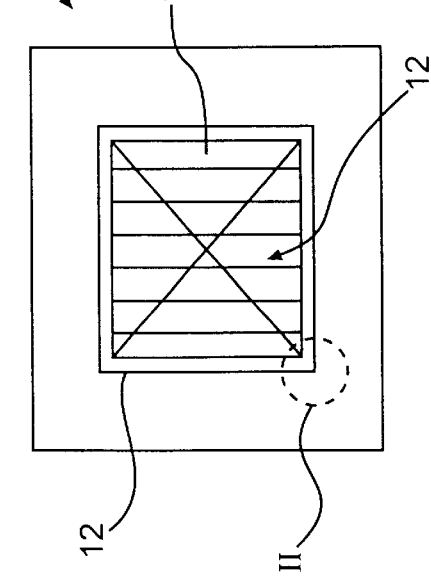
FIG. 1 is a top view of a conventional reticle.
Figure 2:
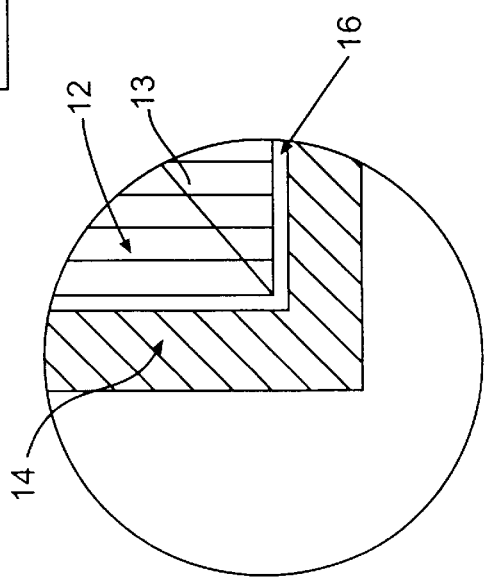
FIG. 2 is a top, magnified view of a portion of the reticle illustrated in FIG. 1.
Figure 3A:
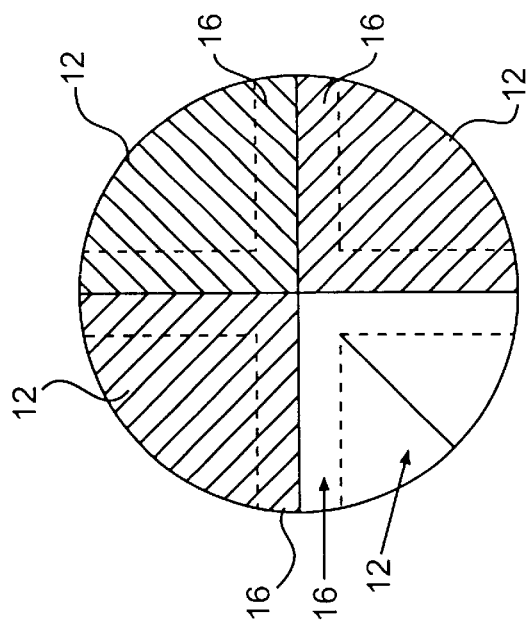
FIG. 3A is a top magnified view of the Wafer of FIG. 3.

As shown in FIG. 5, the kerf region 34 is offset from the first side 24 of the device exposure region 22 by the opaque chrome region 32. Unlike the prior art reticle 10 shown in FIG. 2, the kerf region 34 of the present invention is not located immediately adjacent to the device exposure region 22, but rather the kerf region 34 is separated from the device exposure region 22 by the opaque chrome region 32 equal to or larger than its pattern kerf height (typically 60–150 $\mu$m total). Preferably, the distance between the device exposure region 22 and the kerf region 34, i.e., the width of the opaque chrome region 32, is approximately 80 $\mu$m. The width of the kerf region 34 in the direction towards the device exposure region 22 is substantially the same as a width of the opaque chrome region 32 from the first side 24 of the device exposure region 22 to the kerf region 34. The dimension of the offset may be determined by the width of the Kerf region 34. The opaque chrome region 32 should have a sufficient width for a reticle blind to accurately block the kerf region 34 and the opaque chrome region 32, but not the device exposure region 22 during the double exposure method.

As a result of such offset of the kerf region 34 from the first side 24 of the device exposure region 22, one exposure of a wafer by the reticle 20 in the photolithography process can be interleaved with the adjacent exposures of the wafer.

The reticle 20 may include additional kerf regions, such as second, third, and fourth kerf regions 36, 38, 40 located offset from the second, third, and fourth sides, 26, 28, 30 of the device exposure region 22 correspondingly. The third and fourth kerf regions 38, 40 are not illustrated in FIG. 5. Also, the reticle may include additional kerf regions 42 at each corner of the device exposure region 22. The corner kerf regions 42 are diagonally offset from the device exposure region 22 so that the they can be interleaved with corner kerf regions of adjacent exposures of the wafer.

Figure 6:
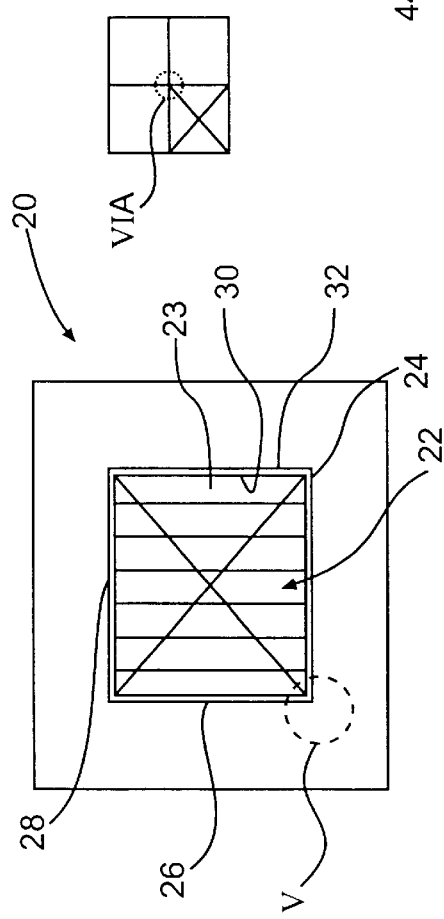
FIG. 6 is a top view of a wafer exposed using the reticle of FIG. 5 according to this invention.
Figure 6A:
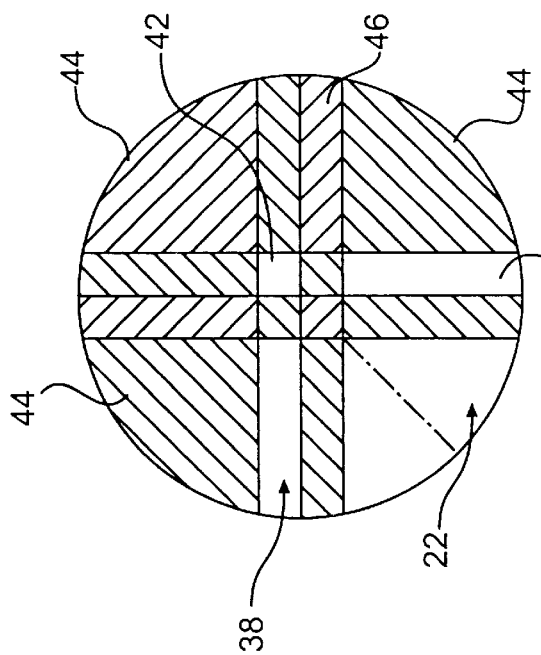
FIG. 6A is a top, magnified view of the wafer of FIG. 6.

This interleaved exposure of wafer is most clearly illustrated in FIGS. 6 and 6A. FIG. 6 shows four exposures of the wafer by the reticle 20. The device exposure region 22 is separated from device exposure regions 44 from other exposures by kerf regions. As illustrated in FIG. 6A, the kerf regions of the adjacent exposures are abut each other and creates one contiguous kerf region 46 on the wafer. The wafer can be diced at the contiguous kerf region 46 into individual semiconductor chips.

It will be apparent to those skilled in the art that various modifications and variations can be made in the reticle of the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being Vindicated by the following claims.

I claim:

1. A reticle used for making a semiconductor device in a photolithography process, comprising:
    a device exposure region having sides and a device pattern within an area defined by the sides;
    an opaque chrome region disposed adjacent to the device region; and
    a kerf region surrounded by the opaque chrome region, the kerf region being offset from the sides of the device exposure region by the opaque chrome region.

2. The reticle of claim 1, wherein the device exposure region has first, second, third, and fourth sides.

3. The reticle of claim 2, wherein the device exposure region has a rectangular shape.

4. The reticle of claim 2, wherein the reticle includes first, second, third, and fourth kerf regions surrounded by the opaque chrome region, and the first, second, third, and fourth kerf regions are located offset from the first, second, third, and fourth sides of the device exposure regions correspondingly.

5. The reticle of claim 2, wherein the reticle includes corner kerf regions surrounded by the opaque chrome region, and each of the corner kerf regions are located diagonally offset from each corner defined by the first, second, third, and fourth sides of the device exposure region.

6. The reticle of claim 1, wherein the opaque chrome region surrounds the device exposure region.

7. The reticle of claim 1, wherein the kerf region has a substantially same width as a width of the opaque chrome region located between the device exposure region and the kerf region.

* * * * *